United States Patent [19]
Park

[11] Patent Number: 6,160,840
[45] Date of Patent: Dec. 12, 2000

[54] APPARATUS AND METHODS FOR PUNCTURING AND RECOVERING CODE IN SPREAD SPECTRUM COMMUNICATION SYSTEM

[75] Inventor: Su-Won Park, Seoul, Rep. of Korea

[73] Assignee: Samsung Electronics Co., Ltd., Rep. of Korea

[21] Appl. No.: 09/126,664

[22] Filed: Jul. 30, 1998

[30] Foreign Application Priority Data

Jul. 30, 1997 [KR] Rep. of Korea ................ 97-36262

[51] Int. Cl.[7] ................ H03M 13/03; H04B 1/707
[52] U.S. Cl. ................ 375/141; 375/146; 375/147; 375/342; 714/790
[58] Field of Search ................ 375/141, 146, 375/147, 259, 295, 340, 342; 714/786, 790

[56] References Cited

U.S. PATENT DOCUMENTS

| | | |
|---|---|---|
| 5,204,876 | 4/1993 | Bruckert et al. . |
| 5,258,995 | 11/1993 | Su et al. . |
| 5,305,349 | 4/1994 | Dent . |
| 5,383,219 | 1/1995 | Wheatley, III et al. . |
| 5,396,518 | 3/1995 | How . |
| 5,408,502 | 4/1995 | How . |
| 5,438,590 | 8/1995 | Tzukerman et al. ............ 375/259 |
| 5,497,395 | 3/1996 | Jou . |
| 5,546,420 | 8/1996 | Seshadri et al. . |
| 5,566,189 | 10/1996 | Laskowski . |
| 5,627,880 | 5/1997 | Rozanski et al. . |
| 5,668,820 | 9/1997 | Ramesh et al. . |
| 5,691,992 | 11/1997 | Molnar et al. . |
| 5,694,429 | 12/1997 | Sekine et al. . |
| 5,722,051 | 2/1998 | Agrawal et al. . |
| 5,734,962 | 3/1998 | Hladik et al. . |
| 5,742,622 | 4/1998 | Claydon et al. . |
| 5,751,739 | 5/1998 | Seshadri et al. . |
| 5,883,899 | 3/1999 | Dahlman et al. ............ 370/468 |

*Primary Examiner*—Amanda T. Le
*Attorney, Agent, or Firm*—Dilworth & Barrese, LLP

[57] ABSTRACT

Apparatus and methods for puncturing and recovering a code in a spread spectrum communication system are provided. Repeated symbols are punctured in predetermined locations and different data is inserted in the punctured locations, in a transmitter. Then, in a receiver, the punctured symbols are recovered by separating the inserted data from input data and filling previous unpunctured symbols in the punctured locations. In another embodiment, the transmitter simply punctures repeated symbols in predetermined locations to obtain an intended symbol rate. Then, the receiver recovers the punctured symbols by filling previous unpunctured symbols in the punctured locations. Therefore, errors at channel decoding are reduced.

9 Claims, 8 Drawing Sheets

APPARATUS AND METHODS FOR PUNCTURING AND RECOVERING CODE IN SPREAD SPECTRUM COMMUNICATION SYSTEM

BACKGROUND OF THE INVENTION

1. Field of the Invention

The present invention relates to a spread spectrum communication system and, more particularly, to a data transmitter and receiver for puncturing actual data, inserting secondary data in the location of the punctured data, and recovering the punctured data.

2. Description of the Related Art

In a spread spectrum communication system, a transmitter channel-encodes actual data and then punctures the encoded data prior to data transmission. A receiver allocates a predetermined value to the punctured locations and relies on the error correction capability of a channel decoder. By simply puncturing the actual data or inserting secondary data, such as power control information needed in the receiver, in the punctured location, a desired symbol rate can be obtained in the spread spectrum communication system.

The above-described punctured coding is a procedure in which the transmitter punctures data within an error correction range relying on the error correction capability of a channel decoder. The receiver inserts predetermined values in place of the punctured data, causes the channel decoder to correct errors, and thus recovers the encoded data to its original form. Therefore, a system employing such a punctured coding scheme has a lower accuracy in data recovery than a system which recovers unpunctured signals. A punctured code is used to obtain a desired symbol rate after channel encoding or transmit data at the same symbol rate by puncturing actual data and inserting secondary data in the punctured locations. Here, both the transmitter and receiver should know the location of punctured transmit and receive data.

FIG. 1 is a block diagram of a transmitter for a conventional spread spectrum communication system, in which a code is punctured prior to transmission. A channel encoder 111 encodes input actual data TXD1, and a symbol repeater 113 repeats the encoded data received from the channel encoder 111 at a predetermined repetition rate. A code puncturer 115 receives the repeated symbols from the symbol repeater 113, via a first input port, and a code TXD2 to be erasure-inserted via a second input port. TXD2 may be control data transmitted from a transmitter to a receiver.

The puncturer 115 selectively outputs the symbols received from the symbol repeater 113, via the first input port, and the code TXD2, received via the second input port, at a predetermined cycle.

Assume that the puncturer 115 is switched to puncture one of every four bits of the data TXD1, represented as D1, D2, D3, . . . , and insert the data TXD2, represented as d1, d2, . . . , in the locations of punctured data. Then, the channel encoder 111 encodes D1, D2, D3, . . . , whereby the encoded data TXD1 is represented as A1, A2, A3, A4, . . . . With two-bit repetition, the symbol repeater 113 outputs A11, A12, A21, A22, A31, A32, A41, A42, . . . . Then, the puncturer 115 punctures the repeated symbols and inserts the data TXD2 in the punctured symbol locations, resulting in A11, A12, A21, d1, A31, A32, A41, d2, . . . . Here, Ai1 and Ai2 are obtained by repeating the same symbol, and thus Ai1=Ai2.

An interleaver 117 interleaves the data received from the puncturer 115 in a predetermined method, and a spreader 119 spreads the interleaved data. A modulator 121 modulates the spread data in a predetermined method to produce data TDATA. The modulated data is converted to a radio signal before being transmitted.

In a receiver shown in FIG. 2, a demodulator 211 demodulates input data RDATA, a despreader 213 despreads the demodulated data, and a deinterleaver 215 deinterleaves the despread data.

The data output from the deinterleaver 215 is represented as a11, a12, a21, δ1, a31, a32, a41, δ2, . . . . Here, a and δ are data A and d transmitted from the transmitter and may be changed during transmission on a channel. A recoverer 217 includes switches 251 and 252. The switch 251 selects data a in the same manner as that of the puncturer 115 and outputs the data a to a channel decoder 219, and selects data δ and outputs the data δ to a detector 221. That is, the switch 251 outputs a11, a12, and a21 to the channel decoder 219, and then switches to output data δ1 to the detector 221. Then, it switches again to output a31, a32, and a41 to the channel decoder 219 and then switches to output δ2 to the detector 221. While the data δ is output from the recoverer 217, the channel decoder 219 receives no data. To prevent this, the switch 252 is switched to output data x at the moment when the data δ is output. Data x is fixed as logic value "0" or "1". Therefore, data input to the channel decoder 219 is represented as a11, a12, a21, x, a31, a32, a41, x, Then, the channel decoder 219 decodes the data received from the recoverer 217 to produce data RXD1, and the detector 221 detects the erasure-inserted data and outputs data RXD2.

As described above, the punctured coding scheme decreases a symbol rate to a desired one after channel encoding, or maintain the symbol rate, before data transmission. In the conventional punctured coding scheme, however, the receiver of FIG. 2 assumes the punctured data as predetermined fixed data at decoding because it is impossible for the receiver to find out the punctured data. In this case, there is no problem when the assumed data is equal to the original punctured data, but when it is not the punctured data and errors are generated beyond the error correction capability of a channel code, the receiver cannot recover the received data reliably.

SUMMARY OF THE INVENTION

Therefore, an object of the present invention is to provide apparatus and methods for puncturing and recovering a code in a spread spectrum communication system, in which data is replaced with secondary data by puncturing on the transmission side, and the punctured data is estimated, using an unpunctured symbol out of repeated symbols, on the reception side, so that errors can be reduced in a channel decoder.

Another object of the present invention is to provide apparatus and methods for puncturing and recovering a code in a spread spectrum communication system, in which data is simply punctured on the transmission side for the purpose of a desired symbol rate, and the punctured data is estimated, using an unpunctured symbol out of repeated symbols, on the reception side, so that errors can be reduced in a channel decoder.

To achieve the above and other objects, the present invention provides a symbol puncturing and recovering apparatus for use in a channel encoding and decoding arrangement of a spread spectrum communication system. In the apparatus, a channel encoder encodes received data and generates symbols and a symbol repeater repeats the symbols at a predetermined repetition rate. A puncturer receives the repeated symbols and erasure-insertion data, punctures the repeated symbols, and inserts the erasure-inserted data in the punctured location, depending on the states of a predetermined control signal. An interleaver interleaves the output of the puncturer. Next, preferably after transmission, a deinterleaver deinterleaves the interleaved symbols. A recoverer receives the deinterleaved symbols, separates the repeated symbols and the erasure-inserted data from the received symbols, and inserts the previous unpunctured repeated symbol in the punctured location. A channel decoder decodes the output of the recoverer, and a detector detects the erasure-insertion data received from the recoverer.

These and other objects, features and advantages of the present invention will become apparent from the following detailed description of illustrative embodiments thereof, which is to be read in connection with the accompanying drawings in which the same reference numerals are used throughout the various figures to designate same or similar components.

DETAILED DESCRIPTION OF PREFERRED EMBODIMENTS

A punctured coding and decoding method according to embodiments of the present invention is intended for a system in which data is transmitted in a wide bandwidth relative to an intended data rate, such as a spread spectrum communication system. In a method of the invention, a transmitter punctures a predetermined symbol in repeated symbols to obtain a desired symbol rate, and a receiver estimates the punctured symbol by use of an unpunctured symbol in the repeated symbols, so that errors inherent in punctured coding are reduced.

Figure 1:
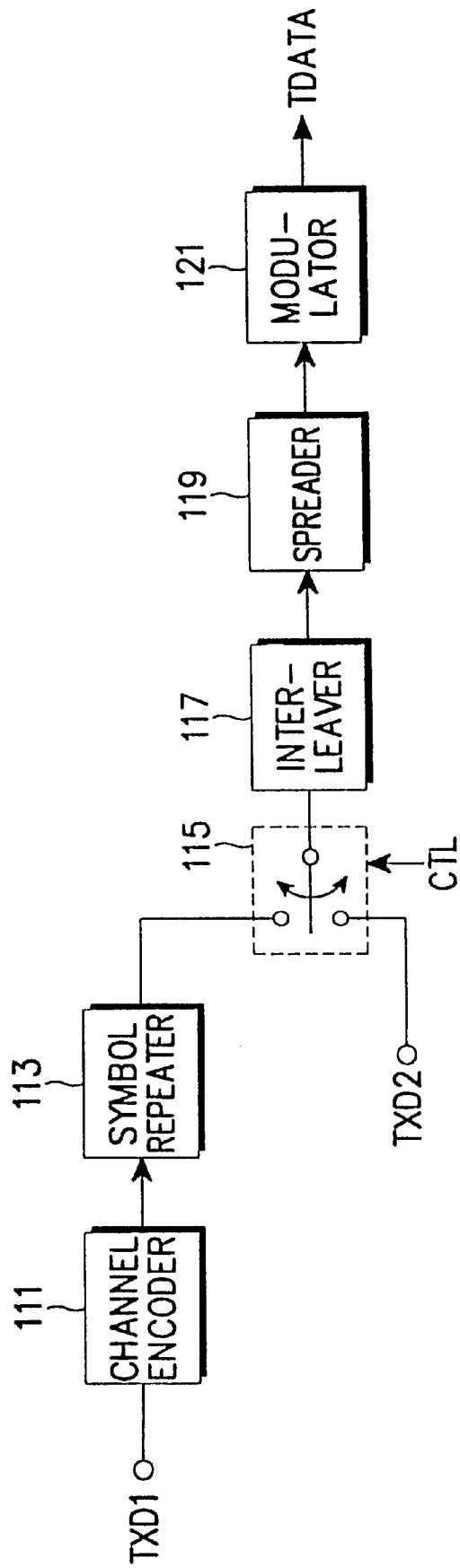
FIG. 1 is a block diagram of a code puncturing arrangement in a transmitter of a conventional spectrum spread communications system.
Figure 2:
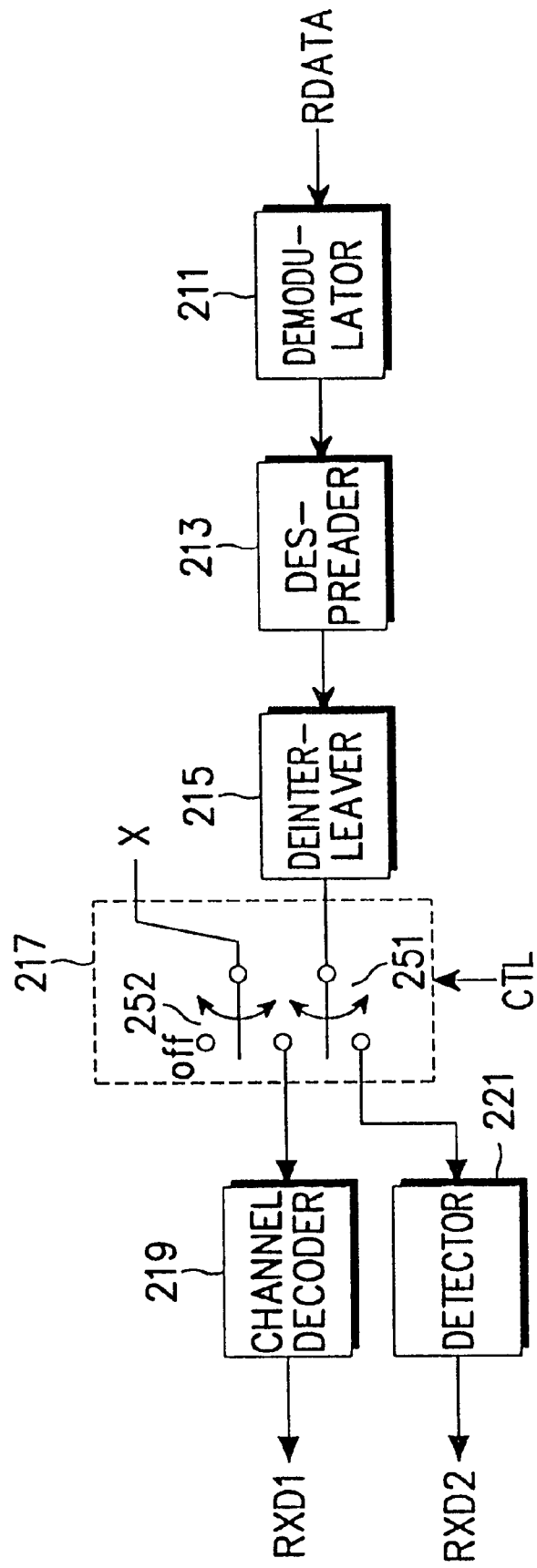
FIG. 2 is a block diagram of a code recovering arrangement in a receiver of a conventional spectrum spread communications system.
Figure 3:
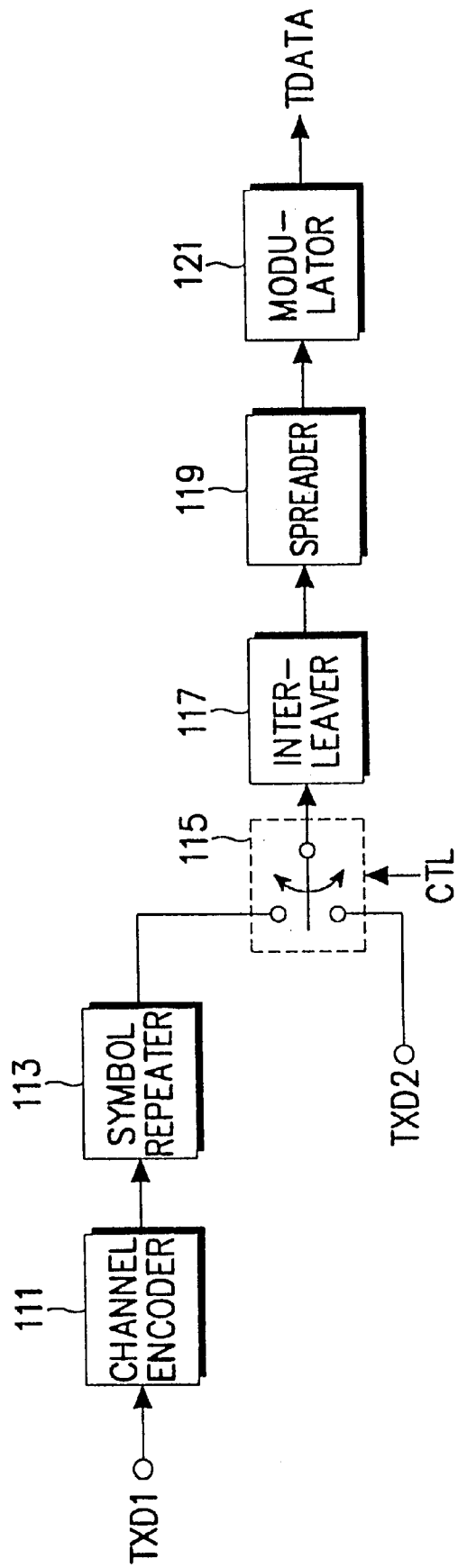
FIG. 3 is a block diagram of code puncturing apparatus in a transmitter of a spread spectrum communications system according to a first embodiment of the present invention.

FIG. 3 is a block diagram of a transmitter for puncturing a code before data transmission in a spread spectrum communication system according to an embodiment of the present invention. The channel encoder 111 encodes the input actual data TXD1, and the symbol repeater 113 repeats the encoded data received from the channel encoder 111 at a predetermined repetition rate. The code puncturer 115 receives the repeated symbols from the symbol repeater 113, via the first input port, and the code TXD2 to be erasure-inserted, via the second input port. The puncturer 115 is switched by a control signal CTL to selectively output the symbols received from the symbol repeater 113, via the first input port, and the data TXD2, received via the second input port, at a predetermined cycle. The control signal CTL is preferably generated by a processor associated with the transmitter.

The interleaver 117 interleaves symbols received from the puncturer 115 in a predetermined method, the spreader 119 spreads the interleaved data, and the modulator 121 modulates the spread data in a predetermined method to generate data TDATA. The modulated data is converted to a radio signal prior to transmission.

Figure 4:
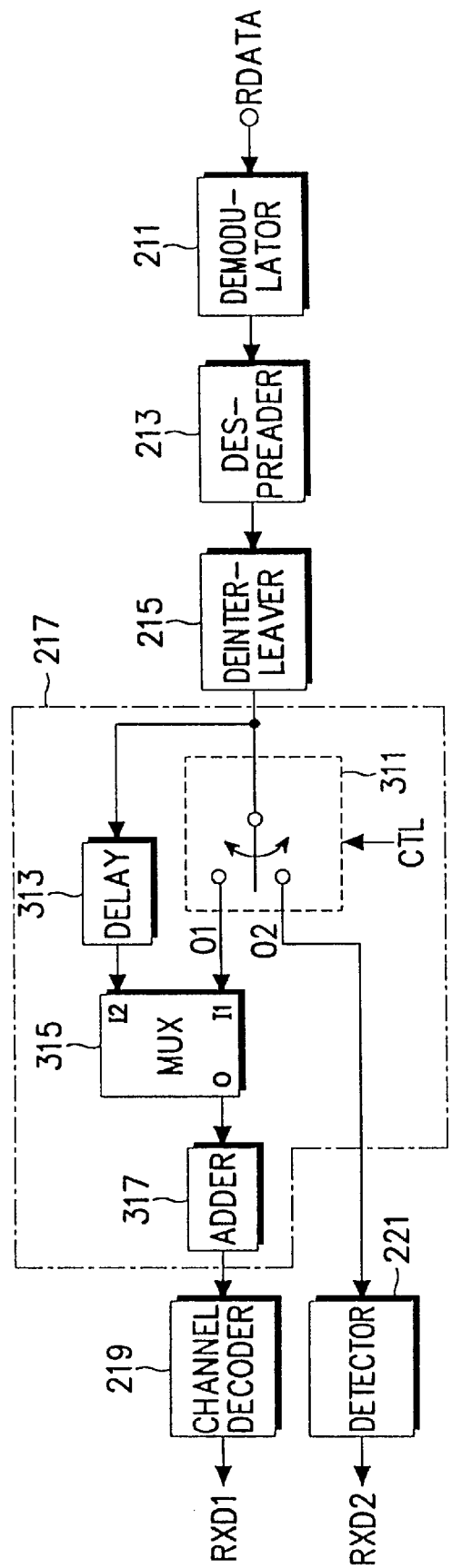
FIG. 4 is a block diagram of code recovering apparatus in a receiver of a spread spectrum communication system according to a first embodiment of the present invention.

FIG. 4 is a block diagram of a receiver according to an embodiment of the present invention.

Referring to FIG. 4, the demodulator 211 demodulates the input data RDATA, the despreader 213 despreads the demodulated data, and the deinterleaver 215 deinterleaves the despread data to thereby recover the original order in which the despread data is arranged.

The recoverer 217 separates the data received from the deinterleaver 215 into actual data and erasure-inserted data. In the recoverer 217, a switch 311 receives the data from the deinterleaver 215, and is switched by a control signal CTL preferably generated by a processor associated with the receiver, to separately output the actual data and the erasure-inserted data. A delay 313 delays the data received from the deinterleaver 215. A multiplexer 315 selectively outputs the data received from the switch 311 and the data received from the delay 313 in the locations of punctured data, under the control of the control signal CTL. An adder 317 adds pairs of repeated symbols from symbols received from the multiplexer 315.

The channel decoder 219 decodes the data received from the recoverer 217 and outputs the data RXD1. The detector 221 detects the erasure-inserted data from the data received from the recoverer 217 and outputs the data RXD2. Here, RXD2 may be an input to another channel decoder.

Referring to FIGS. 3 and 4, a description of data puncturing and recovery operations according to the embodiment of the present invention will now follow.

For the data puncturing, the channel encoder 111 encodes the input data TXD1 to be transmitted, and the symbol repeater 113 repeats symbols received from the channel encoder 111 at a predetermined repetition rate. The puncturer 115 receives the repeated symbols, via the first input port, and the erasure-insertion data TXD2, via the second input port. TXD2 may be, for example, control data transmitted from a transmitter to a receiver. In a first state of the control signal CTL, the puncturer 115 outputs the repeated symbols. On the other hand, the puncturer 115 is switched to output the data TXD2 in a second state of the control signal CTL.

Assume that the control signal CTL is switched in every four bits, the first state indicates the first three bits in a four-bit unit, and the second state indicates the last bit. With the data TXD1 given as D1, D2, D3, . . . , the channel encoder 111 outputs Y1, Y2, Y3, Y4, . . . . In the case of two-bit repetition, the output of the symbol repeater 113 is represented as Y11, Y12, Y21, Y22, Y31, Y32, Y41, Y42, . . . . Therefore, if the erasure-insertion data TXD2 is represented as d1, d2, . . . , the puncturer 115 punctures the repeated symbols and inserts the data TXD2 in the locations of punctured symbols, outputting Y11, Y12, Y21, d1, Y31, Y32, Y41, d2, . . . . Here, Ai1 and Ai2 result from repetition of the same data. Thus, Yi1=Yi2.

In the receiver of FIG. 4, the demodulator 211 demodulates the input data RDATA, the despreader 213 despreads the demodulated data, and the deinterleaver 215 deinteleaves the despread data, thereby recovering the order in which the data is arranged before interleaving. The data output from the deinterleaver 215 is represented as y11, y12, y21, δ1, y31, y32, y41, δ2, . . . . Here, y and δ are the data Y and d output from the transmitter and can be changed during the transmission through a channel.

The recoverer 217 separates the output of the deinterleaver 215 into the actual data yi1 and yi2 and the erasure-insertion data δi. Specifically, the switch 311 is switched to a first output port O1 and outputs the actual data yi in the first state of the control signal CTL, and then to the second output port O2 and outputs the erasure-insertion data δi in the second state of the control signal CTL. That is, the switch 311 is switched by the control signal CTL to separately output the actual data yi and the erasure-insertion data δi.

The delay 313 delays the data yi received from the deinterleaver 215 in synchronization with a symbol clock signal (not shown). Preferably, the data is delayed by one symbol. The multiplexer 315 selectively outputs the data received from the switch 311 and the delay 313 by means of the control signal CTL. That is, the multiplexer 315 outputs the data received from the switch 311, via a first input port I1, in the first state of the control signal CTL, and outputs the data received from the delay 313, via the second input port I2, in the location of punctured data in the second state of the control signal CTL. Here, the data output from the multiplexer 315 in the punctured location is virtually equal to the previous data. Then, the adder 317 adds pairs of repeated symbols out of the symbols received from the multiplexer 315.

To describe the operation of the recoverer 217 by way of example, if the deinterleaver 215 outputs y11, y12, y21, δ1, y31, y32, y41, δ2, . . . , the switch 311 outputs y11, y12, y21, . . . to the multiplexer 315 via the first output port O1 in the first state of the control signal CTL, and δ1, . . . , to the detector 221 via the second output port O2 in the second state of the control signal CTL. The delay 313 delays the data received from the deinterleaver 215 by one bit and outputs x, y11, y12, y21, x, y31, y32, y41, . . . . The multiplexer 315 receives the data from the switch 311, via the first input port I1, and the data from the delay 313, via the second input port I2. Then, the multiplexer 315 selectively outputs the data y11, y12, y21, and y31, y32, y41 in the first state of the control signal CTL, and the data y21, and y41 in the second state of the control signal CTL. Therefore, the output of the multiplexer 315 is y11, y12, y21, y21, y31, y32, y41, y41, . . . . The data output from the multiplexer 315 in the location of punctured data is virtually equal to the previous data. The adder 317 adds pairs of repeated symbols out of the symbols from the multiplexer 315 to output y11+y12, y21+y21, y31+y32, y41+y41, . . . .

The channel decoder 219 decodes the actual data received from the recoverer 217 to produce RDX1 and the detector 221 detects the erasure-insertion data and outputs it as RDX2.

As described above, the transmitter channel-encodes data, repeats symbols, and punctures symbols in predetermined locations, prior to transmission of the data. Then, the receiver repeats an unpunctured symbol in the repeated symbols and inserts it in the punctured data location. Here, the puncturing after the symbol repetition can be performed in two ways: one is to simply puncture the repeated symbols to obtain an intended symbol rate; and the other is to puncture the repeated symbols and then insert different data in the punctured locations.

In the above embodiment, while the symbol repeater 113 implements a two-bit repetition by way of example, symbol repetition varies with a data transmission rate and thus can be performed a predetermined integer times. Then, the operation of the recoverer 217 is adjusted depending on the output of the symbol repeater 113. In addition, the control signal CTL, switched to puncture one bit at a four-bit cycle in this embodiment, may be variably generated according to the data transmission rate. For example, one-bit data may be inserted at an 8-bit data cycle, or two-bit data may be inserted at a 16-bit data cycle, under the control of the control signal CTL.

Figure 5:
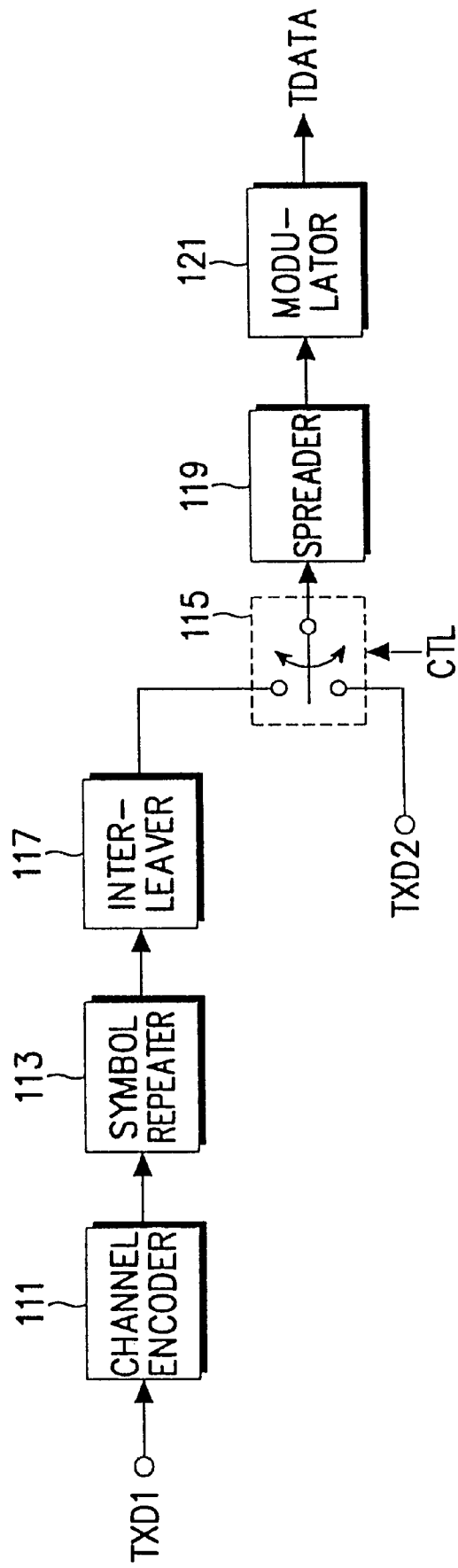
FIG. 5 is a block diagram of modified code puncturing apparatus for puncturing a code after symbol repetition and interleaving, in a transmitter of a spread spectrum communication system according to a first embodiment of the present invention.
Figure 6:
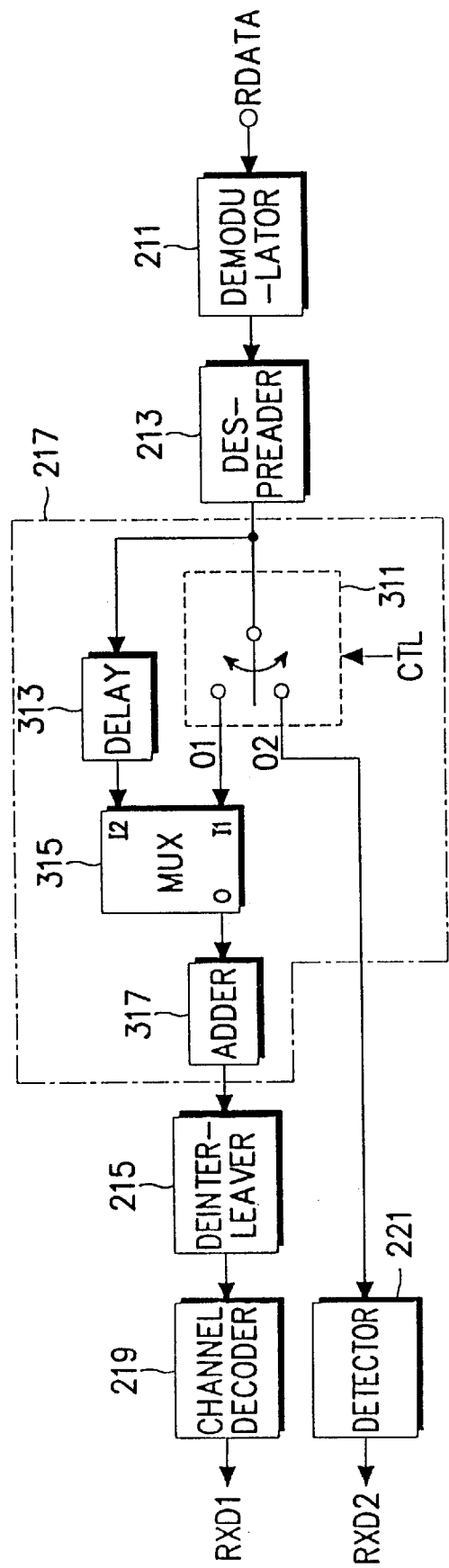
FIG. 6 is a block diagram of code recovering apparatus corresponding to the code puncturing apparatus of FIG. 5.

In a modification to the above embodiment, the puncturer 115 can alternatively be connected to the output port of the interleaver 117, as shown in FIG. 5. Then, the receiver has the recoverer 217 between the despreader 213 and the deinterleaver 215, as shown in FIG. 6, for recovering the punctured code.

It is to be understood that FIGS. 3 to 6 are intended to show a method and apparatus according to the present invention in which secondary data is inserted in the location of punctured data for transmission of data in a transmitter, and the secondary data is separated from the punctured data location and replaced with a repeated symbol in a receiver, in order to minimize errors at the channel decoder. In this case, a symbol rate is not varied.

Figure 7:
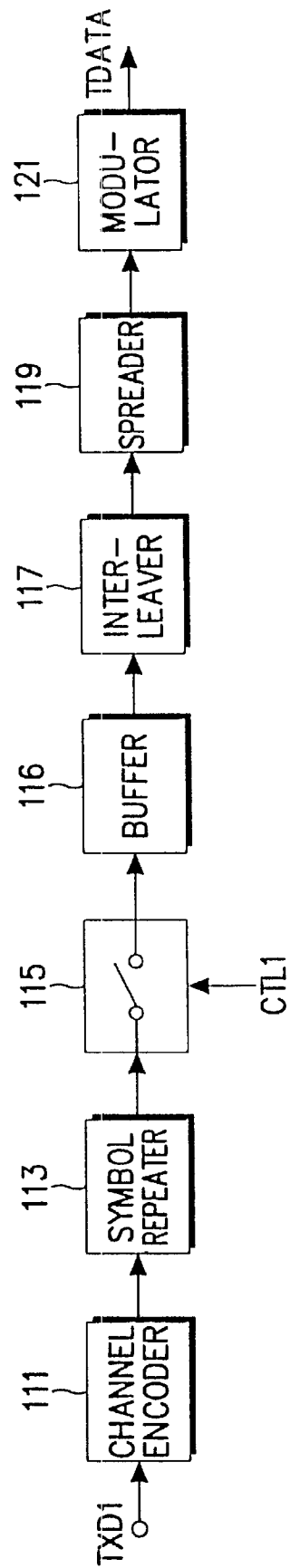
FIG. 7 is a block diagram of code puncturing apparatus in a transmitter of a spread spectrum communications system according to a second embodiment of the present invention.

Meanwhile, a transmitter according to a second embodiment of the present invention varies a symbol rate, as shown in FIG. 7. Referring to FIG. 7, the channel encoder 111 encodes the input actual data TXD1, and the symbol repeater 113 repeats symbols received from the channel encoder 113 at a predetermined repetition rate. The code puncturer 115, having an input port connected to the symbol repeater 113, allows or blocks output of the symbols received from the symbol repeater 113 in accordance with a first control signal CTL1. Again, the control signal CTL1 is preferably generated by a processor associated with the transmitter. A buffer 116 temporarily stores symbols received from the code puncturer 115. Since a predetermined number of symbols are absent in the symbols stored in the buffer 116, in accordance with the first control signal CTL1, a symbol rate is changed.

The interleaver 117 interleaves the symbols received from the buffer 116, the spreader 119 spreads the interleaved data, and the modulator 121 modulates the spread data to yield TDATA in a predetermined method. In the case of a radio system, the modulated data is converted to a radio signal.

Figure 8:
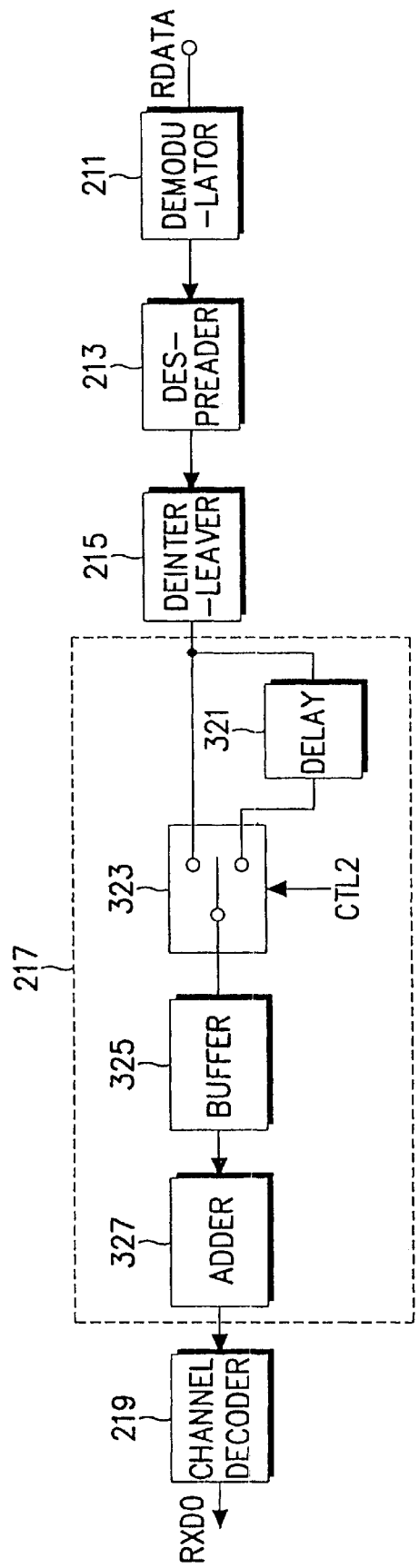
FIG. 8 is a block diagram of code recovering apparatus in a receiver of a spread spectrum communication system according to a second embodiment of the present invention.

FIG. 8 is a block diagram of a receiver according to a second embodiment of the present invention.

Referring to FIG. 8, the demodulator 211 demodulates the input data RDATA, the despreader 213 despreads the demodulated data, and the deinterleaver 215 deinterleaves the despread data to recover the order in which data is arranged before interleaving.

The recoverer 217 recovers the symbols omitted from the symbols received from the deinterleaver 215. In the recoverer 217, a delay 321 delays the symbols received from the deinterleaver 215. A switch 323 has a first input port connected to the output port of the deinterleaver 215 and a second input port connected to the delay 321. The switch 323 is switched in accordance with a second control signal CTL2 to insert symbols received from the delay 321 in the locations of punctured symbols, thereby recovering an original symbol rate. The second control signal CTL2 is preferably generated by a processor associated with the receiver. A buffer 325 temporarily stores the output of the switch 323. An adder 327 adds repeated data out of the output of the buffer 325.

The channel decoder 219 decodes symbols received from the recoverer 217 and outputs data RXD0.

Referring to FIGS. 7 and 8, a description of data puncturing and recovery operations according to the second embodiment of the present invention will now follow.

As for the puncturing operation, the channel encoder 111 encodes the data TXD1 to be transmitted, the symbol repeater 113 repeats symbols received from the channel encoder 113 at a predetermined repetition rate.

The puncturer 115 is switched on to allow output of symbols received from the symbol repeater 113 in the first state of the control signal CTL1, and switched off to block output of the symbols in the second state of the first control signal CTL1. The buffer 116 temporarily stores symbols received from the code puncturer 115. Here, a symbol rate varies with the number of symbols omitted in the code puncturer 115 and the buffer 116 outputs the stored symbols at the varied symbol rate. Therefore, the symbol rate at the buffer 116 is lower than that at the symbol repeater 113.

Assume that the first control signal CTL1 is switched at a four-bit data cycle, and placed in the first state for the first three bits in a four-bit unit and in the second state for the last bit. With TXD1 given as D1, D2, D3, . . . , the channel encoder 111 outputs Y1, Y2, Y3, Y4, . . . , and the symbol repeater 113 outputs Y11, Y12, Y21, Y22, Y31, Y32, Y41, Y42, . . . , in the case of two-bit repetition. By the first control signal CTL1 switched on for the first three symbols and off for the last one symbol at a four-symbol cycle, the symbols from the code puncturer 115 through the buffer 116 are represented as Y11, Y12, Y21, Y31, Y32, Y41, . . . . Here, Yi1 and Yi2 result from repeating the same data and thus they are equal.

In the receiver of FIG. 8, the demodulator 211 demodulates the input data RDATA, the despreader 213 despreads the demodulated data, and the deinterleaver 215 deinterleaves the despread data and outputs y11, y12, y21, y31, y32, y41, . . . . Here, y is equal to Y output from the transmitter and can be varied during the transmission on a channel.

The recoverer 217 recovers the original symbol rate by inserting an unpunctured repeated symbol yi1 as yi2 in a punctured location.

Specifically, the delay 321 delays the symbols received from the deinterleaver 215 in synchornization with a symbol clock signal (not shown). Preferably, the data is delayed by one symbol. Then, the switch 323 receives the symbols from the deinterleaver 215, via the first input port, and the symbols from the delay 321, via the second input port. Here, the second control signal CTL2 should be set to the second state in the punctured symbol location for a half symbol. Therefore, the switch 323 is switched by the second control signal CTL2 and twice repeats the previous unpunctured symbol in the punctured symbol location. Then, the buffer 325 temporarily stores the symbols received from the switch 323 and outputs it at the original symbol rate. The adder 327 adds pairs of repeated symbols from symbols received from the buffer 325.

For example, if the deinterleaver 215 outputs y11, y12, y21, y31, y32, y41, . . . , the delay 311 delays the output of the deinterleaver 215 by one symbol and outputs x, y11, y12, y21, x, y31, y32, y41, . . . . Then, the switch 323 selectively outputs y11, y12, y21, y31, y32, . . . , received via the first input port, and x, y11, y12, y21, x, y31, y32, y41, received via the second input port, resulting in y11, y12, y21, y21, y31, y32, y41, . . . . That is, since the second input port is switched on for a half symbol in the location of the punctured symbol y21 in accordance with the second control signal CTL2, the buffer 325 stores y11, y12, y21, y21, y31, y32, y41, . . . and outputs the symbols at the recovered symbol rate. Then, the adder 317 adds pairs of repeated symbols from the symbols received from the buffer 325. That is, the adder 317 outputs y11+y12, y21+y21, y31+y32, y41+y41, . . . .

In accordance with the present invention, in such a system as a spread spectrum communication system where a transmission bandwidth is wide relative to an intended data transmission rate and the energy strength of a transmission signal is significant, a transmitter punctures at least one of repeated symbols before transmission, and a receiver recovers the punctured symbol by inserting an unpunctured repeated symbol in the punctured location. The symbol inserted in the punctured location is a delayed version of the previous symbol. Therefore, the symbols are the same resulting from repetition of the same symbol. Further, there is no increase in data rate in the case of erasure-insertion of different data in a punctured location, thereby obviating the need for increasing system clock signals or clock generators.

As described above, the present invention has the advantage of a decrease in an error rate at channel decoding because part of repeated symbols are punctured on a transmission side and the punctured symbols can be relatively accurately estimated using unpunctured symbols on a reception side.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. Apparatus for symbol puncturing and recovering for use in a channel encoding and decoding arrangement of a spread spectrum communication system, comprising:

a channel encoder for encoding received data and generating symbols;

a symbol repeater for repeating the symbols at a predetermined repetition rate;

a puncturer for receiving the repeated symbols and erasure-insertion data, puncturing the repeated symbols, and inserting the erasure-inserted data in the punctured location, depending on states of a predetermined control signal;

an interleaver for interleaving the output of the puncturer;

a deinterleaver for deinterleaving the interleaved symbols;

a recoverer for receiving the deinterleaved symbols, separating the repeated symbols and the erasure-inserted data from the received symbols, and inserting a previous unpunctured repeated symbol in a punctured location;

a channel decoder for decoding the output of the recoverer; and a detector for detecting the erasure-insertion data received from the recoverer.

2. The apparatus of claim 1, wherein the recoverer comprises:

a switch for receiving the deinterleaved data and selectively outputting unpunctured symbols and punctured symbols, respectively, in first and second states of the control signal;

a delay for delaying the unpunctured symbols of the switch in synchronization with a symbol clock signal; and a multiplexer for receiving the unpunctured and delayed symbols from the switch and the delay and selectively outputting the unpunctured symbols in the first state of the control signal, and the delayed symbols in the locations of the punctured symbols in the second state of the control signal.

3. Apparatus for symbol puncturing and recovering for use in a channel encoding and decoding arrangement of a spread spectrum communication system, comprising:

a channel encoder for encoding received data and generating symbols;

a symbol repeater for repeating the symbols at a predetermined repetition rate;

an interleaver for interleaving the output of the symbol repeater;

a puncturer for receiving the interleaved symbols and erasure-insertion data, puncturing the interleaved symbols, and inserting the erasure-inserted data in the punctured location, depending on states of a predetermined control signal;

a recoverer for receiving the punctured symbols, separating the repeated symbols and the erasure-inserted data from the received symbols, and inserting a previous unpunctured repeated symbol in a punctured location;

a deinterleaver for deinterleaving the recovered symbols;

a channel decoder for decoding the output of the deinterleaver; and a detector for detecting the erasure-insertion data received from the recoverer.

4. The apparatus of claim 3, wherein the recoverer comprises:

a switch for receiving the deinterleaved data and selectively outputting unpunctured symbols and punctured symbols, respectively in first and second states of the control signal;

a delay for delaying the unpunctured symbols of the switch in synchronization with a symbol clock signal; and a multiplexer for receiving the unpunctured and delayed symbols from the switch and the delay and selectively outputting the unpunctured symbols in the first state of the control signal, and the delayed symbols in the locations of the punctured symbols in the second state of the control signal.

5. A code puncturing and recovering method for use in a channel encoding and decoding arrangemnet of a spread spectrum communication system, the method comprising the steps of:

encoding received data and generating symbols;

repeating the symbols at a predetermined repetition rate;

receiving the repeated symbols and erasure-insertion data, puncturing the repeated symbols, and inserting the erasure-inserted data in the punctured location, depending on states of a predetermined control signal;

interleaving the punctured-inserted symbols;

deinterleaving the interleaved symbols;

receiving the deinterleaved symbols, separating the repeated symbols and the erasure-inserted data from the received symbols, and inserting a previous unpunctured repeated symbol in a punctured location to thereby output the same repeated symbols; and decoding the recovered symbols.

6. The method of claim 5, wherein the recovering step comprises the steps of:

receiving the deinterleaved data and selectively outputting unpunctured symbols and punctured symbols, respectively, in first and second states of the control signal;

delaying the unpunctured symbols in synchronization with a symbol clock signal; and receiving the unpunctured and delayed symbols and selectively outputting the unpunctured symbols in the first state of the control signal, and the delayed symbols in the locations of the punctured symbols in the second state of the control signal.

7. A symbol puncturing and recovering method for use in a channel encoding and decoding arrangement of a spread spectrum communication system, comprising:

encoding received data and generating symbols;

repeating the symbols at a predetermined repetition rate;

interleaving the repeated symbols;

receiving the interleaved symbols and erasure-insertion data, puncturing the interleaved symbols, and inserting the erasure-inserted data in the punctured location, depending on states of a predetermined control signal;

separating the repeated symbols and the erasure-inserted data from the punctured-inserted symbols, and inserting a previous unpunctured repeated symbol in a punctured location to thereby output the same recovered symbols;

deinterleaving the recovered symbols; and decoding the deinterleaved symbols.

8. The method of claim 7, wherein the recovering steps comprises the steps of:

receiving the deinterleaved data and selectively outputting unpunctured symbols and punctured symbols, respectively in first and second states of the control signal;

delaying the unpunctured symbols in synchronization with a symbol clock signal; and receiving the unpunctured and delayed symbols and selectively outputting the unpunctured symbols in the first state of the control signal, and the delayed symbols in the locations of the punctured symbols in the second state of the control signal.

9. Apparatus for symbol puncturing and recovering for use in a channel encoding and decoding arrangement apparatus of a spread spectrum communication system, comprising:

a channel encoder for encoding received data and generating symbols;

a symbol repeater for repeating the symbols at a predetermined repetition rate;

a puncturer for receiving the repeated symbols, and puncturing the repeated symbols at a predetermined cycle;

a buffer for temporarily storing the output of the puncturer;

an interleaver for interleaving the output of the buffer;

a deinterleaver for deinterleaving the interleaved symbols;

a recoverer for receiving the deinterleaved symbols, and inserting a previous unpunctured repeated symbol in a location of a punctured symbol; and a channel decoder for decoding the output of the recoverer, whereby a symbol rate is decreased on a transmission side and recovered on a reception side.

* * * * *